United States Patent
Danioni et al.

(10) Patent No.: US 6,885,172 B2
(45) Date of Patent: Apr. 26, 2005

(54) DEVICE FOR DRIVING A POWER TRANSISTOR OF A VOLTAGE CONVERTER PROVIDED WITH A PIEZOELECTRIC TRANSFORMER AND CORRESPONDING VOLTAGE CONVERTER

(75) Inventors: Alberto Danioni, Pavia (IT); Giulio Ricotti, Broni (IT)

(73) Assignee: STMicroelectronics s.r.l., Agrate Brianza (IT)

( * ) Notice: Subject to any disclaimer, the term of this patent is extended or adjusted under 35 U.S.C. 154(b) by 0 days.

(21) Appl. No.: 10/698,052

(22) Filed: Oct. 29, 2003

(65) Prior Publication Data

US 2004/0135555 A1 Jul. 15, 2004

(30) Foreign Application Priority Data

Oct. 29, 2002  (IT) ..................................... MI2002A2299

(51) Int. Cl.[7] ............................. G05F 1/10; G05F 1/656
(52) U.S. Cl. ........................ 323/222; 323/303; 323/282
(58) Field of Search ................................ 323/222, 303, 323/282, 284

(56) References Cited

U.S. PATENT DOCUMENTS

| | | | | |
|---|---|---|---|---|
| 5,886,477 A | * | 3/1999 | Honbo et al. ......... | 315/209 PZ |
| 5,886,514 A | * | 3/1999 | Iguchi et al. ............... | 323/299 |
| 6,016,052 A | * | 1/2000 | Vaughn ....................... | 323/355 |
| 6,111,765 A | * | 8/2000 | Ganser et al. ................. | 363/55 |
| 6,661,072 B1 | * | 12/2003 | Cheng ......................... | 257/431 |
| 6,801,028 B1 | * | 10/2004 | Kernahan et al. ........... | 323/283 |
| 6,825,644 B1 | * | 11/2004 | Kernahan et al. ........... | 323/283 |

* cited by examiner

*Primary Examiner*—Bao Q. Vu
(74) *Attorney, Agent, or Firm*—Lisa K. Jorgenson; Stephen Bongini; Fleit, Kain, Gibbons, Gutman, Bongini & Bianco P.L.

(57) ABSTRACT

A driving device is provided for driving at least one power transistor of a voltage converter that includes a piezoelectric transformer. The power transistor has a first non-drivable terminal coupled to an input voltage and to the input of the piezoelectric transformer. The converter includes an inductor coupled between the input voltage and the piezoelectric transformer, and a resistor coupled between a second non-drivable terminal of the power transistor and ground. The driving device is coupled to the drivable terminal of the power transistor, to the input of the piezoelectric transformer, and to the second non-drivable terminal of the power transistor so as to detect a first voltage value and a second current value. The driving device is adapted to cause the turning on of the power transistor if the first voltage value is equal to a third prefixed voltage value, and to cause the turning off of the power transistor if the second current value is equal to a fourth prefixed current value.

18 Claims, 3 Drawing Sheets

DEVICE FOR DRIVING A POWER TRANSISTOR OF A VOLTAGE CONVERTER PROVIDED WITH A PIEZOELECTRIC TRANSFORMER AND CORRESPONDING VOLTAGE CONVERTER

CROSS-REFERENCE TO RELATED APPLICATIONS

This application is based upon and claims priority from prior Italian Patent Application No. MI2002A002299, filed Oct. 29, 2002, the entire disclosure of which is herein incorporated by reference.

BACKGROUND OF THE INVENTION

1. Field of the Invention

The present invention relates to voltage converters, and more particularly to a device for driving a power transistor of a voltage converter provided with a piezoelectric transformer and a voltage converter including such a device.

2. Description of Related Art

Switching voltage regulators provided with power transistors driven suitably by circuitry are generally known. In some cases the regulators include some piezoelectric transformers adapted to convert the applied electrical energy by exploiting a mechanical resonance.

The value of the output voltage in a piezoelectric transformer depends greatly on the value of the frequency of the input signal; in fact the piezoelectric transformer is adapted to transfer electrical energy only in a very narrow frequency band around its mechanical resonance frequency. With respect to the typical electromagnetic transformers, piezoelectric transformers present the advantages of having reduced sizes and weights and a high efficiency (on the order of 90%). For this reason it is used in different applications in which small size and high efficiency requirements are fundamental, as in the case of portable devices that are supplied from batteries.

FIG. 1 shows the electrical circuit equivalent for a piezoelectric transformer in the case in which the input signal is at the mechanical resonance of the transformer. A first series of components constituted by a capacitor Cd1 and a resistor Rc is arranged in parallel to a second series of components constituted by a resistor R, an inductor L, a capacitor C, and a voltage generator Vout/N (where N is the transformer ratio and Vout is the output voltage). A current I2 goes through the second series of components, and both the first series of components and the second series of components are connected between an input voltage Vin and ground. The circuit also includes a current generator I2/N and a capacitor Cd2 connected in parallel to one another and connected between the output voltage Vout and ground. The capacitor Cd1 generally has a high value and this causes the application of an input voltage Vin of the sinusoidal type for keeping the efficiency of the transformer high.

Normally a filtering inductor is placed upstream of the transformer in voltage converters that have piezoelectric transformers; the value of the inductor is selected according to the capacitor Cd1 and the mechanical resonance frequency.

FIGS. 2 and 3 show two circuit configurations of a switching DC/DC converter. In FIG. 2, an inductor L1 filters a square wave signal derived from the half bridge constituted by transistors M1 and M2, which are connected in series between a voltage Vin1 and ground and are driven by a driving device 5. The inductor L1 is connected to the non-drivable terminal common to the transistors M1 and M2 and to a piezoelectric transformer 1 that has the electrical circuit equivalent shown in FIG. 1. The output sinusoidal voltage signal of the piezoelectric transformer 1 is rectified by a rectifier circuit 2 and is applied to a load LOAD. A part of the voltage Vo applied to the load, that is the voltage R2*Vo/(R1+R2), is supplied to the inverting terminal of an error amplifier 3. The non-inverting terminal is connected to a reference voltage Vref. The output signal of the error amplifier 3 is supplied to a voltage controlled oscillator (VCO) 4 that causes the switching frequency to be sent to the driving device 5; the driving of the transistors M1 and M2 occurs with a duty cycle of 50%. The VCO 4 is normally set for operating in a frequency interval A that is monotone, fixed. and belongs to the transfer characteristic of the transformer, as shown in FIG. 4. The frequency is changed according to the desired output voltage. When using the converter shown in FIG. 2, the determination of the resonance frequency of the transformer, which may change based on the resistive value of the load and based on the operating temperature, is difficult and therefore the suitable setting of the VCO 4 is difficult.

FIG. 3 shows a DC/DC converter which differs from the circuit of FIG. 2 by the presence of a single MOS power transistor M3 having its source terminal connected to ground and its drain terminal connected to an inductor L2, which has in turn its other terminal connected to the input voltage Vin1. The driving device 6 drives the single transistor M3 with a duty cycle of 50%. In this circuit a quasi-sinusoidal signal is applied to the piezoelectric transformer 1 due to the resonance between the inductor L2 and the capacitor Cd1 of the transformer 1. The capacitor Cd1 is discharged before the turning on of the transistor M3 and before the consequent recharging of the inductor L2. In such a circuit, the efficiency of the transformer is linked to the switching frequency.

SUMMARY OF THE INVENTION

In view of these drawbacks, it is an object of the present invention to provide a device for driving a power transistor of a voltage converter provided with a piezoelectric transformer that overcomes these drawbacks.

Another object of the present invention is to provide a voltage converter that includes such a device.

One embodiment of the present invention provides a driving device for driving at least one power transistor of a voltage converter that includes a piezoelectric transformer. The power transistor has a first non-drivable terminal coupled to an input voltage and to the input of the piezoelectric transformer. The converter includes an inductor coupled between the input voltage and the piezoelectric transformer, and a resistor coupled between a second non-drivable terminal of the power transistor and ground. The driving device is coupled to the drivable terminal of the power transistor, to the input of the piezoelectric transformer, and to the second non-drivable terminal of the power transistor so as to detect a first voltage value and a second current value. The driving device is adapted to cause the turning on of the power transistor if the first voltage value is equal to a third prefixed voltage value, and to cause the turning off of the power transistor if the second current value is equal to a fourth prefixed current value.

Another embodiment of the present invention provides a switching voltage converter that includes a piezoelectric transformer, at least one power transistor, an inductor, a driving device, and a resistor. The power transistor has a first non-drivable terminal coupled to an input voltage and to an input of the piezoelectric transformer. The inductor is coupled between the input voltage and the piezoelectric transformer, and the driving device is coupled to the drivable terminal of the at least one power transistor. The resistor is coupled between a second non-drivable terminal of the at least one power transistor and ground. The driving device is also coupled to the input of the piezoelectric transformer and to the second non-drivable terminal of the at least one power transistor so as to detect a first voltage value and a second current value. The driving device is adapted to cause the turning on of the at least one power transistor if the first voltage value is equal to a third prefixed voltage value, and to cause the turning off of the at least one power transistor if the second current value is equal to a fourth prefixed current value.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
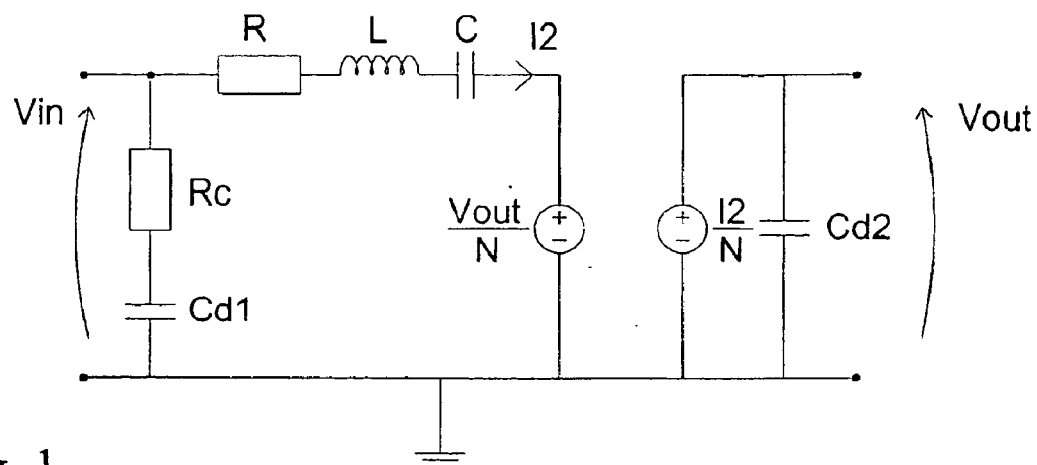
FIG. 1 is an electrical circuit equivalent of a piezoelectric transformer.
Figure 2:
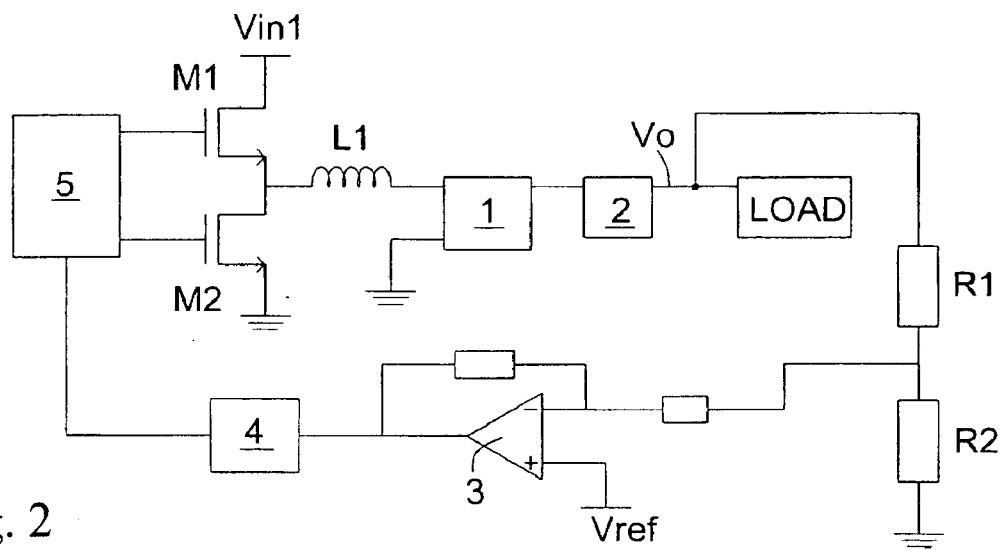
FIG. 2 shows a conventional switching DC/DC converter.
Figure 3:
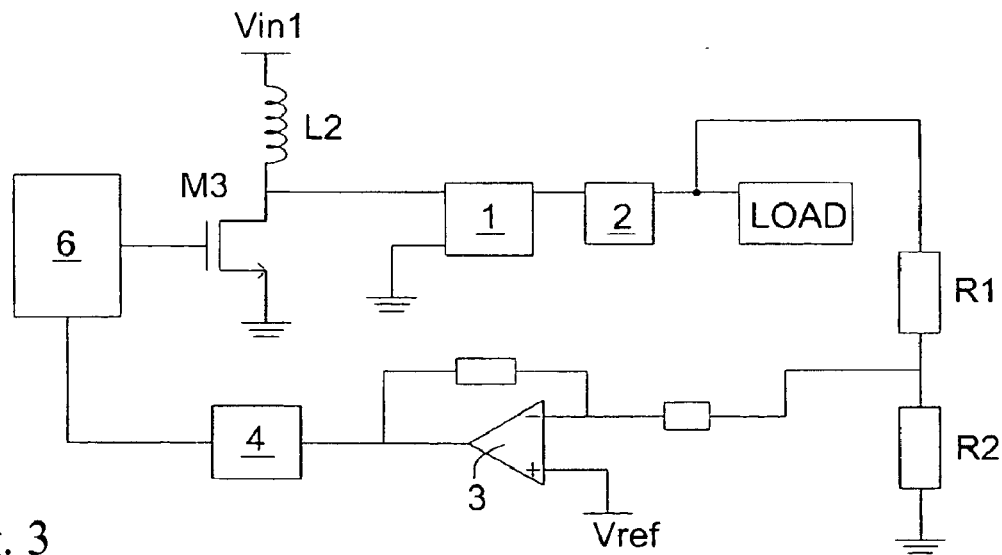
FIG. 3 shows another conventional switching DC/DC converter.
Figure 5:
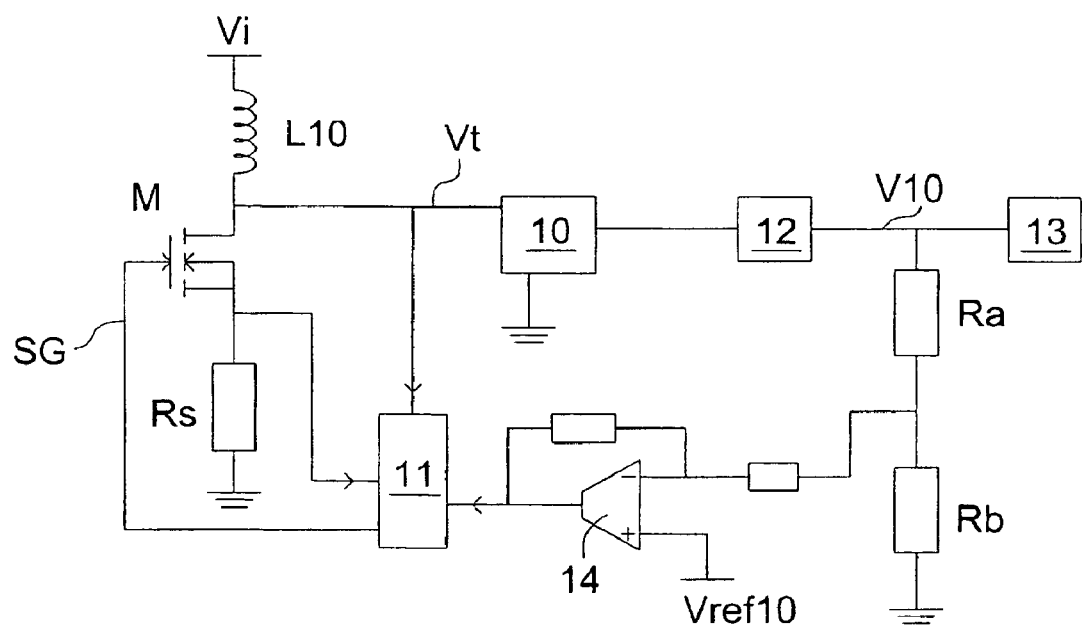
FIG. 5 shows a DC/DC converter that includes a driving device for driving a power transistor in accordance with a preferred embodiment of the present invention.

FIG. 5 shows a DC/DC converter that includes a driving device for driving a power transistor in accordance with a preferred embodiment of the present invention. The converter includes a MOS power transistor M that has its drain terminal coupled to an input voltage Vi and to the input of a piezoelectric transformer 10, which has the electrical circuit equivalent shown in FIG. 1. The output voltage of the piezoelectric transformer 10 is supplied to the rectifier circuit 12 and the rectified voltage V10 is applied to a load 13. The converter also includes an inductor L10 that is inserted in the electrical path between the input voltage Vi and the piezoelectric transformer 10. For example, it is inserted between the drain terminal of the transistor M and the input voltage Vi in the exemplary embodiment of FIG. 5. The converter further includes a driving device 11 which is coupled to the driving terminal of the power transistor M and which is adapted to cause the turning on and off thereof for prefixed time periods. The converter also includes a resistor Rs coupled between the source terminal of the transistor M and ground. During the turning on step of the transistor M, the input voltage of the transformer is low and is determined by the current flowing through the inductor L10 and by the resistor Rs. In this step, the inductor L10 is charged by energy. At the turning off of the transistor M, the energy of the inductor L10 is discharged on the capacitor Cd1 of the transformer 10 by producing the sinusoidal half wave that excites the transformer 10.

The driving device 11 is coupled to the input of the piezoelectric transformer 10 and to the source terminal of the power transistor M so as to detect a first voltage value Vt and a second current value. The driving device is adapted to cause the turning on and the turning off of the power transistor M if the first voltage value Vt is equal to a third prefixed voltage value and the second current value is equal to a fourth prefixed current value, respectively. The last value is set by the output signal of a transconductance error amplifier 14 which receives at its inverting terminal a part of the voltage V10 applied to the load 13, that is the voltage Rb*V10/(Ra+Rb). The non-inverting terminal is connected to a reference voltage Vref10, for example of 820 mV.

Figure 6:
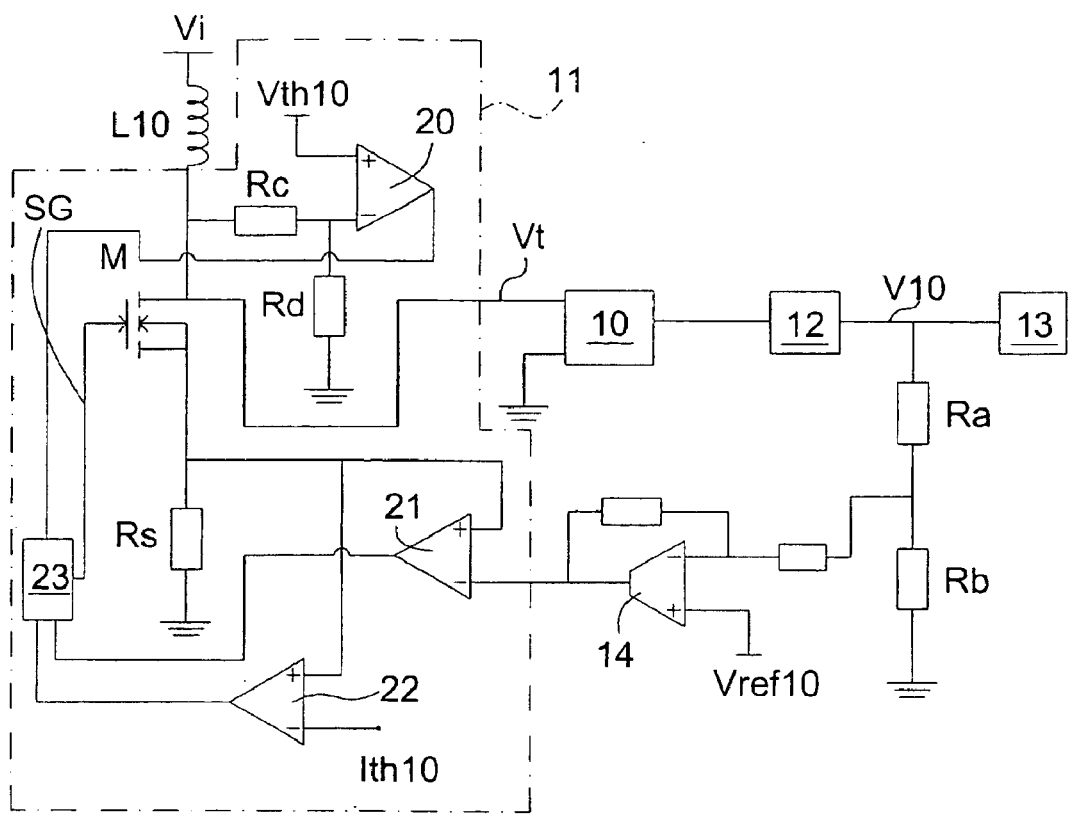
FIG. 6 shows in detail one embodiment of a DC/DC converter according to the present invention.

FIG. 6 shows in detail one embodiment of a DC/DC converter according to the present invention. As shown, the driving device 11 of this exemplary embodiment includes the comparators 20 and 21 and the logic circuit 23 for driving the transistor M. The comparator 20 has its inverting terminal coupled to the drain terminal of the transistor M and its non-inverting terminal connected to a reference voltage Vth10 (for example of 820 mV) that corresponds to the third voltage value. The inverting terminal of the comparator 20 is preferably coupled to the drain terminal of the transistor M through a resistive divider made up of a resistor Rd arranged between the inverting terminal and ground and a resistor Rc arranged between the inverting terminal and the drain terminal of the transistor M. The comparator 21 has its inverting terminal connected to the output of the error amplifier 14 and its non-inverting terminal connected to the source terminal of the transistor M. The comparator 20 sends a signal to the logic circuit 23 for turning on the transistor M when the voltage Vt at the drain terminal is equal to the voltage Vth10, while the comparator 21 sends a signal to the logic circuit 23 for turning off the transistor M when the value of the current at the source terminal, that is the current that goes through the resistor Rs, is equal to the current value of the output signal of the error amplifier 14.

The driving device 11 preferably also includes another comparator 22 having its non-inverting terminal connected to the source terminal of the transistor M and its inverting terminal connected to a reference current Ith10, for example of 700 mA. When the current in the resistor Rs is equal to the value of the current Ith10, the comparator 22 sends a signal to the logic circuit 23 for turning off the transistor M.

With the use of such a driving device 11, the value of the inductor L10 no longer depends on the value of the mechanical resonance of the transformer 10 and on the capacitor Cd1, but instead serves only to generate the sinusoidal arc adapted to excite the transformer 10.

Figure 4:
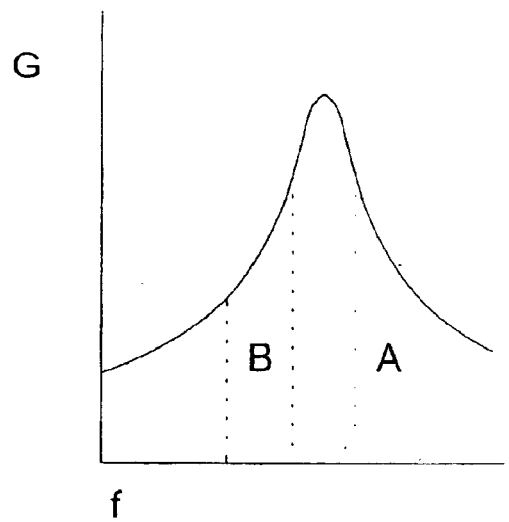
FIG. 4 shows the characteristic of the gain G as a function of the frequency f of a piezoelectric transformer.

Further, the switching frequency may be changed by changing the value of the resistor Rs, so as to extend or shorten the time period in which the inductor is charged. The maximum current value at the resistor Rs is set by the error amplifier in dependence on the value of the output voltage V10 and the reference voltage Vref10. If the output voltage increases the switching frequency decreases and therefore, with reference to FIG. 4, the frequency interval to use for the transfer characteristic of the transformer is the interval B.

The presence of the driving device 11 allows the value of the inductor L10 to be unlinked from the transformer features, so as to allow a high efficiency for all of the frequency values.

Figure 7:
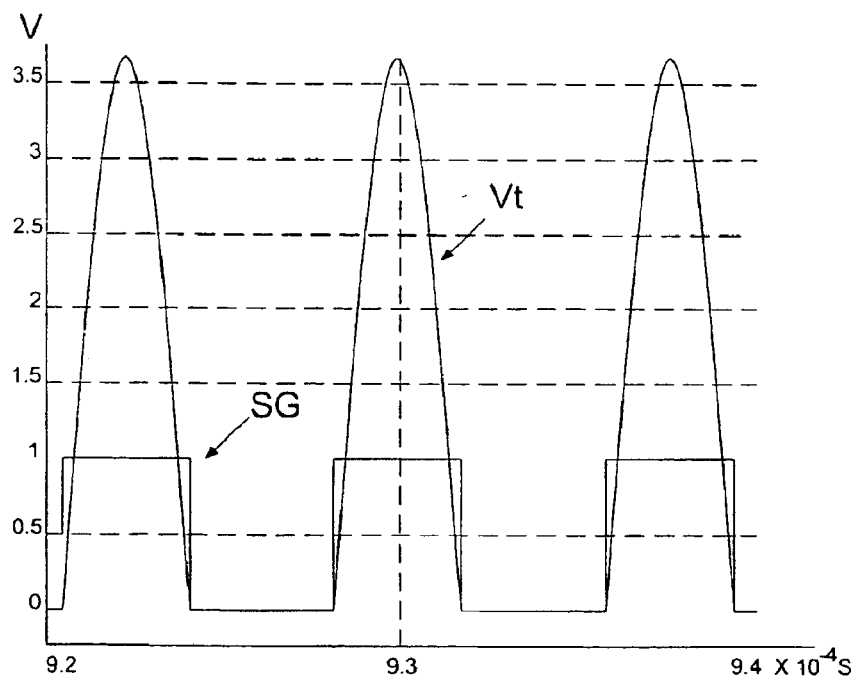
FIG. 7 shows the driving signal of the power transistor and the waveform of the input voltage of the piezoelectric transformer in the converter of FIG. 6.

In FIG. 7, the waveform of the input signal Vt of the piezoelectric transformer 10 and the waveform of the driving signal SG at the gate terminal of the MOS transistor M in the converter of FIG. 6 are shown.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A driving device for driving at least one power transistor of a voltage converter that includes a piezoelectric transformer, the at least one power transistor having a first non-drivable terminal coupled to an input voltage and to the input of the piezoelectric transformer, the converter further including an inductor coupled between the input voltage and the piezoelectric transformer, and a resistor coupled between a second non-drivable terminal of the at least one power transistor and ground, the driving device being coupled to the drivable terminal of the at least one power transistor, to the input of the piezoelectric transformer, and to the second non-drivable terminal of the at least one power transistor so as to detect a first voltage value and a second current value, the driving device being adapted to cause the turning on of the at least one power transistor if the first voltage value is equal to a third prefixed voltage value, and being adapted to cause the turning off of the at least one power transistor if the second current value is equal to a fourth prefixed current value.

2. The driving device according to claim 1, wherein the converter includes an error amplifier having an input connected to a voltage that is proportional to the output voltage of the converter, and another input connected to a reference voltage, the fourth prefixed current value being the value of the output current of the error amplifier and the second current value being the value of the current that goes through the resistor.

3. The driving device according to claim 2, wherein the third prefixed voltage value is a second reference voltage and the first voltage value is the value of the input voltage of the piezoelectric transformer.

4. The driving device according to claim 3, wherein the driving device comprises:
a first comparator; and
a second comparator,
wherein the first comparator has an input coupled to the input of the piezoelectric transformer and another input coupled to the second reference voltage, the first comparator being adapted to cause the turning on of the at least one power transistor if the first voltage value is equal to the reference voltage, and the second comparator is coupled to the second non-drivable terminal of the at least one power transistor and to the output of the error amplifier, the second comparator being adapted to cause the turning off of the at least one power transistor if the value of the current going through the resistor is equal to the output current of the error amplifier.

5. The driving device according to claim 4, wherein the driving device further comprises a third comparator having an input coupled to the second non-drivable terminal of the at least one power transistor and another input coupled to a reference current, the third comparator being adapted to cause the turning off of the at least one power transistor when the value of the current going through the resistor is equal to the value of the reference current.

6. The driving device according to claim 1, wherein the driving device comprises:
a first comparator; and
a second comparator,
wherein the first comparator has an input coupled to the input of the piezoelectric transformer and another input coupled to a reference voltage, the first comparator being adapted to cause the turning on of the at least one power transistor if the first voltage value is equal to the reference voltage, and the second comparator is coupled to the second non-drivable terminal of the at least one power transistor and to the output of an error amplifier, the second comparator being adapted to cause the turning off of the at least one power transistor if the value of the current going through the resistor is equal to the output current of the error amplifier.

7. The driving device according to claim 1, wherein the driving device comprises a third comparator having an input coupled to the second non-drivable terminal of the at least one power transistor and another input coupled to a reference current, the third comparator being adapted to cause the turning off of the at least one power transistor when the value of the current going through the resistor is equal to the value of the reference current.

8. The driving device according to claim 1, wherein the inductor is directly connected to the input voltage and to the input of the piezoelectric transformer.

9. The driving device according to claim 1, wherein the at least one power transistor is a single MOS transistor, the first non-drivable terminal being the drain terminal of the MOS transistor and the second non-drivable terminal being the source terminal of the MOS transistor.

10. A switching voltage converter comprising:
a piezoelectric transformer;
at least one power transistor having a first non-drivable terminal coupled to an input voltage and to an input of the piezoelectric transformer;
an inductor coupled between the input voltage and the piezoelectric transformer;
a driving device coupled to the drivable terminal of the at least one power transistor;
a resistor coupled between a second non-drivable terminal of the at least one power transistor and ground,
wherein the driving device is also coupled to the input of the piezoelectric transformer and to the second non-drivable terminal of the at least one power transistor so as to detect a first voltage value and a second current value, the driving device being adapted to cause the turning on of the at least one power transistor if the first voltage value is equal to a third prefixed voltage value, and being adapted to cause the turning off of the at least one power transistor if the second current value is equal to a fourth prefixed current value.

11. The converter according to claim 10, further comprising an error amplifier having an input connected to a voltage that is proportional to the output voltage of the converter, and another input connected to a reference voltage, the fourth prefixed current value being the value of the output current of the error amplifier and the second current value being the value of the current that goes through the resistor.

12. The converter according to claim 11, wherein the third prefixed voltage value is a second reference voltage and the first voltage value is the value of the input voltage of the piezoelectric transformer.

13. The converter according to claim 12, wherein the driving device comprises:

a first comparator; and a second comparator, wherein the first comparator has an input coupled to the input of the piezoelectric transformer and another input coupled to the second reference voltage, the first comparator being adapted to cause the turning on of the at least one power transistor if the first voltage value is equal to the reference voltage, and the second comparator is coupled to the second non-drivable terminal of the at least one power transistor and to the output of the error amplifier, the second comparator being adapted to cause the turning off of the at least one power transistor if the value of the current going through the resistor is equal to the output current of the error amplifier.

14. The converter according to claim 13, wherein the driving device further comprises a third comparator having an input coupled to the second non-drivable terminal of the at least one power transistor and another input coupled to a reference current, the third comparator being adapted to cause the turning off of the at least one power transistor when the value of the current going through the resistor is equal to the value of the reference current.

15. The converter according to claim 10, wherein the driving device comprises:

a first comparator; and a second comparator, wherein the first comparator has an input coupled to the input of the piezoelectric transformer and another input coupled to a second reference voltage, the first comparator being adapted to cause the turning on of the at least one power transistor if the first voltage value is equal to the reference voltage, and the second comparator is coupled to the second non-drivable terminal of the at least one power transistor and to the output of an error amplifier, the second comparator being adapted to cause the turning off of the at least one power transistor if the value of the current going through the resistor is equal to the output current of the error amplifier.

16. The converter according to claim 10, wherein the driving device comprises a third comparator having an input coupled to the second non-drivable terminal of the at least one power transistor and another input coupled to a reference current, the third comparator being adapted to cause the turning off of the at least one power transistor when the value of the current going through the resistor is equal to the value of the reference current.

17. The converter according to claim 10, wherein the inductor is directly connected to the input voltage and to the input of the piezoelectric transformer.

18. The converter according to claim 10, wherein the at least one power transistor is a single MOS transistor, the first non-drivable terminal being the drain terminal of the MOS transistor and the second non-drivable terminal being the source terminal of the MOS transistor.

* * * * *